(12) United States Patent
Ito et al.

(10) Patent No.: US 7,485,266 B2
(45) Date of Patent: Feb. 3, 2009

(54) MICRO FLUID CHIP

(75) Inventors: Yuzuru Ito, Tsuchiura (JP); Yoshishige Endo, Tsuchiura (JP); Akira Koide, Azuma (JP)

(73) Assignee: Hitachi Industries Co., Ltd.

( * ) Notice: Subject to any disclaimer, the term of this patent is extended or adjusted under 35 U.S.C. 154(b) by 788 days.

(21) Appl. No.: 11/039,940

(22) Filed: Jan. 24, 2005

(65) Prior Publication Data

US 2006/0029528 A1    Feb. 9, 2006

(30) Foreign Application Priority Data

Aug. 6, 2004   (JP) .............................. 2004-230055
Oct. 6, 2004   (JP) .............................. 2004-293179

(51) Int. Cl.
- *B01J 19/26* (2006.01)
- *B01F 340/06* (2006.01)
- *B01J 19/00* (2006.01)

(52) U.S. Cl. ........................ 422/224; 366/336; 366/340; 366/341

(58) Field of Classification Search ........................ None
See application file for complete search history.

(56) References Cited

U.S. PATENT DOCUMENTS 5,957,579 A    9/1999    Kopf-Sill et al.

FOREIGN PATENT DOCUMENTS

| EP | 1 415 708 | 5/2004 |
| JP | 2002-346355 | 12/2002 |
| JP | 2003-001077 | 1/2003 |

OTHER PUBLICATIONS

Schwesinger et al, "Modular Microfluid System With An Integrated Micromixer", J. Micromech Microengineering, Journal of Micromechanics and Microengineering Mar. 1999 Institute of Physics Publishing Ltd., Bristol, Engl. vol. 6, No. 1, Sep. 3, 1995 pp. 99-102.

*Primary Examiner*—Krishnan S Menon
(74) *Attorney, Agent, or Firm*—Antonelli, Terry, Stout & Kraus, LLP.

(57) ABSTRACT

The invention relates to a micro fluid chip that leads liquids supplied from a plurality of liquid supply ports, respectively, to a minute flow passage, performs mixing and reaction (chemical reaction) of the liquids in the minute flow passage, and obtains a liquid having been processed from a liquid discharge port. A micro fluid chip that leads liquids supplied from a plurality of liquid supply ports, respectively, to a minute flow passage, performs mixing/reaction of the liquids in the minute flow passage, and obtains a liquid having been processed from a liquid discharge port, the micro fluid chip comprising liquid supplies that supply a plurality of flows, which are formed by division of two kinds of liquids, respectively, in an alternate arrangement, and a flow flattening portion provided downstream of the liquid supplies to be configured in flow passage such that liquids alternately arranged are decreased in dimension as they go downstream and increased in dimension in a direction, which intersects the direction of arrangement and a direction of flow, as they go downstream, to be made substantially the same or slightly large in cross sectional area in the direction of flow. According to the invention, liquids of large flow rates can be processed at high speed and an apparatus is not made large in size.

8 Claims, 13 Drawing Sheets

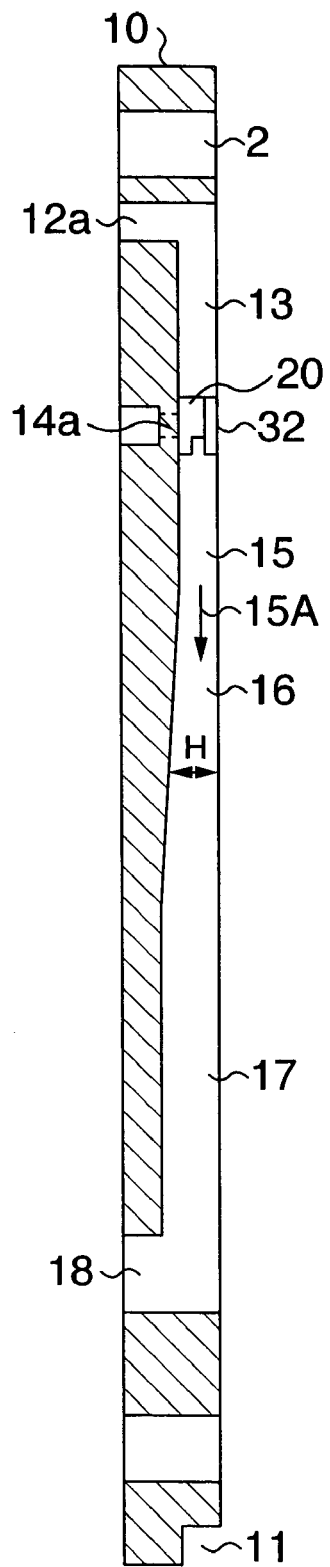
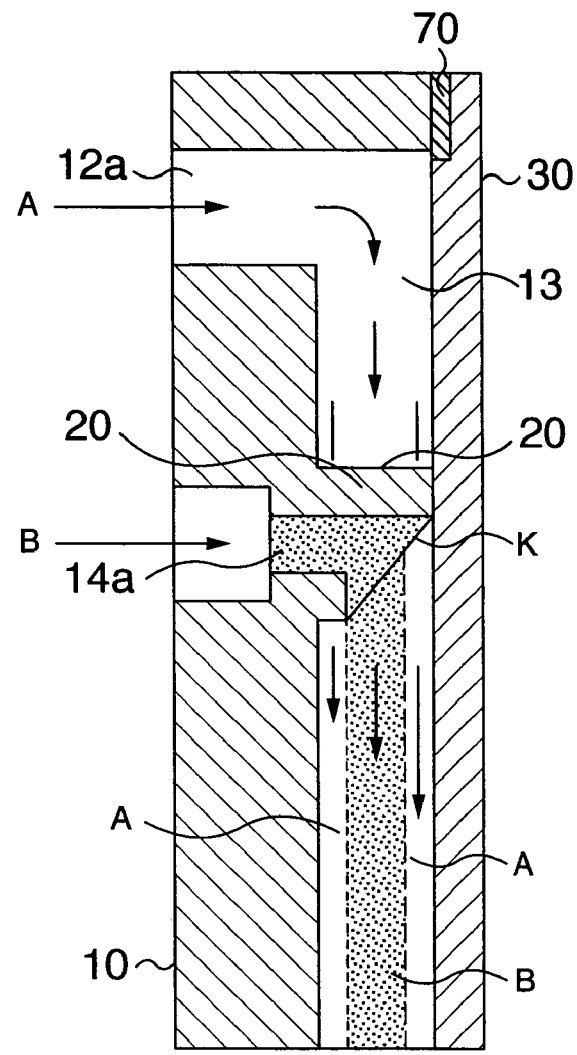

MICRO FLUID CHIP

BACKGROUND OF THE INVENTION

The present invention relates to a micro fluid chip that leads liquids supplied from a plurality of liquid supply ports, respectively, to a minute flow passage, performs mixing and reaction (chemical reaction) of the liquids in the minute flow passage, and gets a processed liquid from a liquid discharge port.

A micro fluid chip is an apparatus that supplies a plurality of liquids to a minute flow passage having a width of and a depth of several μm to several hundreds μm and performs mixing and reaction of the liquids in the minute flow passage on the basis of the spontaneous behavior of molecules and particles, which constitute the liquids.

That is, the Reynolds number of liquids amounts to several hundreds or less in a minute flow passage provided in a micro fluid chip, and thus laminar flow becomes dominant unlike conventional reaction apparatuses, in which turbulent flow is dominant. Mixing/reaction of liquids under the domination of laminar flow is mainly caused by molecular diffusion at contact interfaces of the respective liquids, and the speed of molecular diffusion is prescribed by a thickness (a distance, over which different kinds of liquids should diffuse until they get uniform in concentration, =diffusion length) of the liquids in a direction of diffusion.

Many of conventional micro fluid chips is intended for analysis of liquids, and mixing/reaction of liquids at flow rate of several μl/min to several tens μl/min is performed in a minute flow passage having a small width (=short diffusion length) of several hundreds μm or less.

Concretely, micro fluid chips are known as disclosed in JP-A-2003-1077, in which a plurality of liquids, respectively, are divided into a multiplicity of laminar flows, and the laminar flows are arranged alternately to form a laminate flow, in which a ratio of contact areas of the respective liquids to a total volume of the liquids is increased, thus enabling mixing of liquids in high efficiency, and micro fluid chips are known as disclosed in JP-A-2002-346355, in which liquids are arranged in thin filmy flows, which are laminated perpendicularly to a flow direction, and mixing of liquids is performed by that agitating flow, which is generated by intermittently constricting the laminated flows.

With the prior art described above, micro fluid chips are designed on the assumption that small quantities of liquids in the order of several tens μl/min are analyzed, and when liquids are caused to flow at flow rate of the order of several tens ml/min for the purpose of mixing/reaction of the liquids, flow passages are too minute and so internal pressure loss becomes excessive to make flow at a desired flow rate impossible, so that an increase in throughput cannot be expected. Also, when liquids pass through minute flow passages at high speed, diffusion becomes insufficient to get expected mixing/reaction.

In order to achieve an increase in throughput and to get sure mixing/reaction, there is a need for parallel processing with the use of a plurality of micro fluid chips called numbering-up, so that a whole apparatus is made large in size.

Pressure loss in a minute flow passage in a micro fluid chip is greatly affected by the viscosity of a liquid. This is because a ratio of a circumference of a cross section to a cross sectional area of a flow passage is high and friction loss due to the viscosity is great at wall surfaces of the flow passage. Therefore, when a high-viscosity liquid is supplied to a micro fluid chip, stagnation and accumulation due to pressure loss are generated near wall surfaces, so that it becomes difficult to correctly feed the liquid.

In particular, in case of supplying a low-viscosity liquid and a high-viscosity liquid to give rise to mixing and reaction, a difference in pressure loss between the low-viscosity liquid and the high-viscosity liquid is generated, so that even when the low-viscosity liquid flows through a minute flow passage relatively smoothly, the high-viscosity liquid becomes stagnant. Accordingly, even when liquids are initially supplied at a desired ratio, a difference in flow rate is generated while the liquids flow through the minute flow passage, and one of the liquids becomes smaller in quantity than the other of the liquids, so that mixing at a desired ratio cannot be achieved when mixing should be done, and yield is decreased when reaction should be done. Then, the high-viscosity liquid becomes gradually stagnant in the minute flow passage to occupy a major part of the flow passage, so that desired mixing and reaction cannot be achieved.

BRIEF SUMMARY OF THE INVENTION

Therefore, it is an object of the invention to provide a micro fluid chip that can process liquids of large flow rates at high speed and eliminates large-sizing of an apparatus.

Also, it is an object of the invention to provide a micro fluid chip capable of supplying a plurality of liquids including a high-viscosity liquid to continuously give rise to desired mixing and reaction.

To attain the above objects, a micro fluid chip according to the invention is characterized in a micro fluid chip that leads liquids supplied from a plurality of liquid supply ports, respectively, to a minute flow passage, performs mixing/reaction of the liquids in the minute flow passages, and obtains a liquid having been processed from a liquid discharge port, by the provision of a liquid supply that supplies a plurality of flows, which are formed by division of at least two kinds of liquids, in an alternate arrangement, and a flow flattening portion provided downstream of the liquid supply to be configured in flow passage such that liquids alternately arranged in the liquid supply are decreased in dimension in a direction, in which the liquids are arranged, as they go downstream, and increased in dimension in a direction, which intersects the direction of arrangement and a direction of flow, as they go downstream, to be made substantially the same or slightly large in cross sectional area in the direction of flow.

Further, to attain the above objects, a micro fluid chip according to the invention is characterized by the provision of a processing portion provided downstream of the flow flattening portion to have a flow passage, of which a cross section at a connection thereof to the flow flattening portion in a flow intersecting direction, is maintained up to the liquid discharge port as it is, and of which a length ensures a stagnation time elapsed until mixing or reaction of the respective liquids supplied from the liquid supply is terminated.

When liquids arranged alternately in the liquid supply are decreased in dimension in a direction of arrangement as they go downstream, the respective liquids arranged alternately become small (a diffusion length is shortened) in width in the direction of arrangement. And so it is liable to consider that diffusion is favorable in progress, but a flow passage decreases in cross sectional area in a flow direction when dimensions in a direction intersecting the direction of arrangement and the flow direction are maintained in the flow direction. Then, pressure loss increases to make flow at large flow rate impossible.

Hereupon, dimensions in the direction intersecting the direction of arrangement and the flow direction are increased in the flow direction so that the flow passage is made the same or slightly large in cross sectional area in the flow direction, whereby an increase in pressure loss is prevented and liquids at large flow rates can be made to flow.

When liquids arranged alternately in the liquid supply are decreased in dimension in a direction, in which the liquids are arranged, as they go downstream, the respective liquids arranged alternately become small in width in the direction of arrangement. And when dimensions in a direction intersecting the direction of arrangement and a flow direction are increased in the flow direction, contact areas of adjacent liquids are increased per unit length in the flow direction.

When a cross sectional area of a connection of a succeeding processing portion and the flow flattening portion in a direction intersecting the flow be maintained up to a liquid discharge port, contact areas, per unit length in the flow direction, of adjacent liquids can be maintained also in the processing portion, so that a stagnation time until termination of mixing or reaction of the respective liquids supplied from the liquid supplies can be shortened and the flow passage in the processing portion is decreased in length, thereby enabling making an apparatus small in size.

Accordingly, since liquids can be made to flow at high speed and a flow rate, of which a single micro fluid chip can dispose, is increased, it is possible according to the invention to reduce the number of parallel processings to avoid large-sizing of an apparatus.

Also, a micro fluid chip according to the invention to attain the above object is characterized in a micro fluid chip that leads liquids supplied from a plurality of liquid supply ports, respectively, to a minute flow passage, performs mixing/reaction of the liquids in the minute flow passage, and obtains a liquid having been processed from a liquid discharge port, by the liquid supply ports allowing at least two kinds of liquids to be supplied individually, a guide passage for a high-viscosity liquid being opened to a flow passage of a low-viscosity liquid, and an opening of the guide passage being provided in flow of the low-viscosity liquid.

Accordingly, since the low-viscosity liquid is present around the high-viscosity liquid to prevent the high-viscosity liquid from contacting directly with wall surfaces of the minute flow passage, the high-viscosity liquid is not stagnant in flow, so that it is possible according to the invention to continuously obtain a processed liquid having been subjected to desired mixing and reaction of the liquids.

Besides, since contact area between the high-viscosity liquid and the low-viscosity liquid are increased, molecular diffusion of the liquids is favorable in progress to be able to cause desired mixing and reaction of the liquids at high efficiency.

Other objects, features and advantages of the invention will become apparent from the following description of the embodiments of the invention taken in conjunction with the accompanying drawings.

BRIEF DESCRIPTION OF THE SEVERAL VIEWS OF THE DRAWINGS

FIG. 17 is a vertical cross sectional view of the micro fluid chip taken along the cutting plane line VII-VII in FIG. 10;

FIG. 19 is a partial vertical cross sectional view showing a micro fluid chip according to a still further embodiment of the invention and corresponding to FIG. 15.

DETAILED DESCRIPTION OF THE INVENTION

Figure 1:
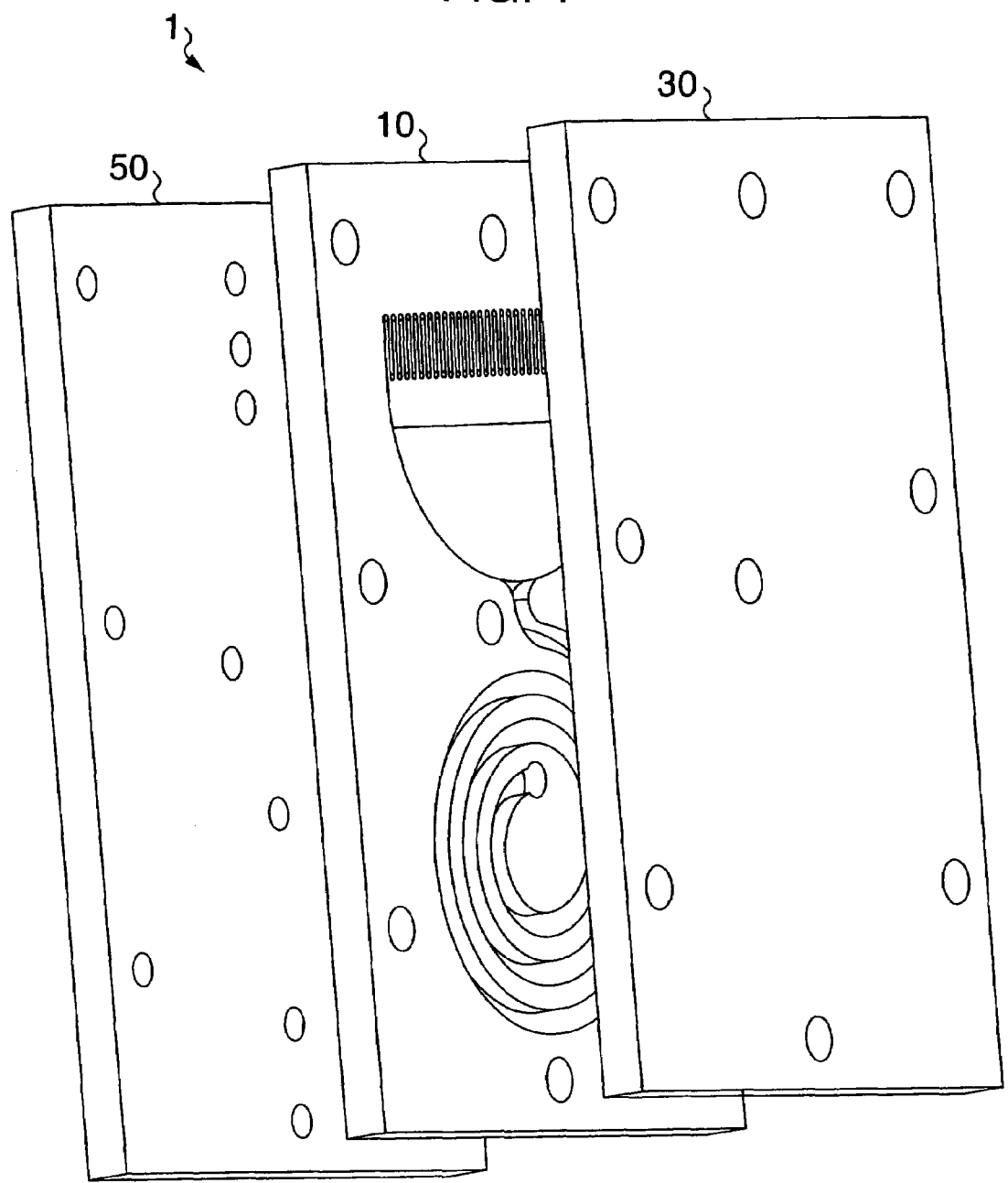
FIG. 1 is a schematic, exploded, perspective view showing a micro fluid chip according to an embodiment of the invention.

Embodiments shown in the drawings will be described below.

While a micro fluid chip that mixes two kinds of liquids will be shown and described below as embodiments of a micro fluid chip of the invention, the invention is in no way limited to the embodiments.

FIG. 1 is a schematic, exploded, perspective view showing a whole micro fluid chip 1.

The micro fluid chip 1 comprises a micro fluid chip body 10 formed from a plate, which is made of metal, glass, silicone, resin, etc. according to kinds of liquids being subjected to processing such as mixing, reaction, or the like and has a thickness of several mm, a lid member 30 arranged on one main surface of the micro fluid chip body 10 to constitute a roof portion of flow passages in the micro fluid chip body 10, an adapter member 50 arranged on another main surface of the micro fluid chip body 10 opposed to the lid member 30 to couple a liquid feed mechanism such as a pump, etc. to the chip, and sealing members 70, 90 (see FIG. 3) arranged among these three members, and a screw clamping prevents liquid leakage.

While an adhesive packing material, a metallic packing material, etc. may be used for the sealing members, other methods such as laser bonding, adhesives, etc. may be used to fix the lid member 30 and the adapter member 50 directly to two sides of the micro fluid chip body 10. In addition, in FIG. 1, ellipses drawn on the micro fluid chip body 10, the lid member 30, and the adapter member 50 indicate screw holes. Also, while holes serving as passages of stock solutions being supplied and processed liquids being discharged are provided on the adapter member 50 and the sealing member 90, respectively, detailed depiction thereof is omitted.

Figure 2:
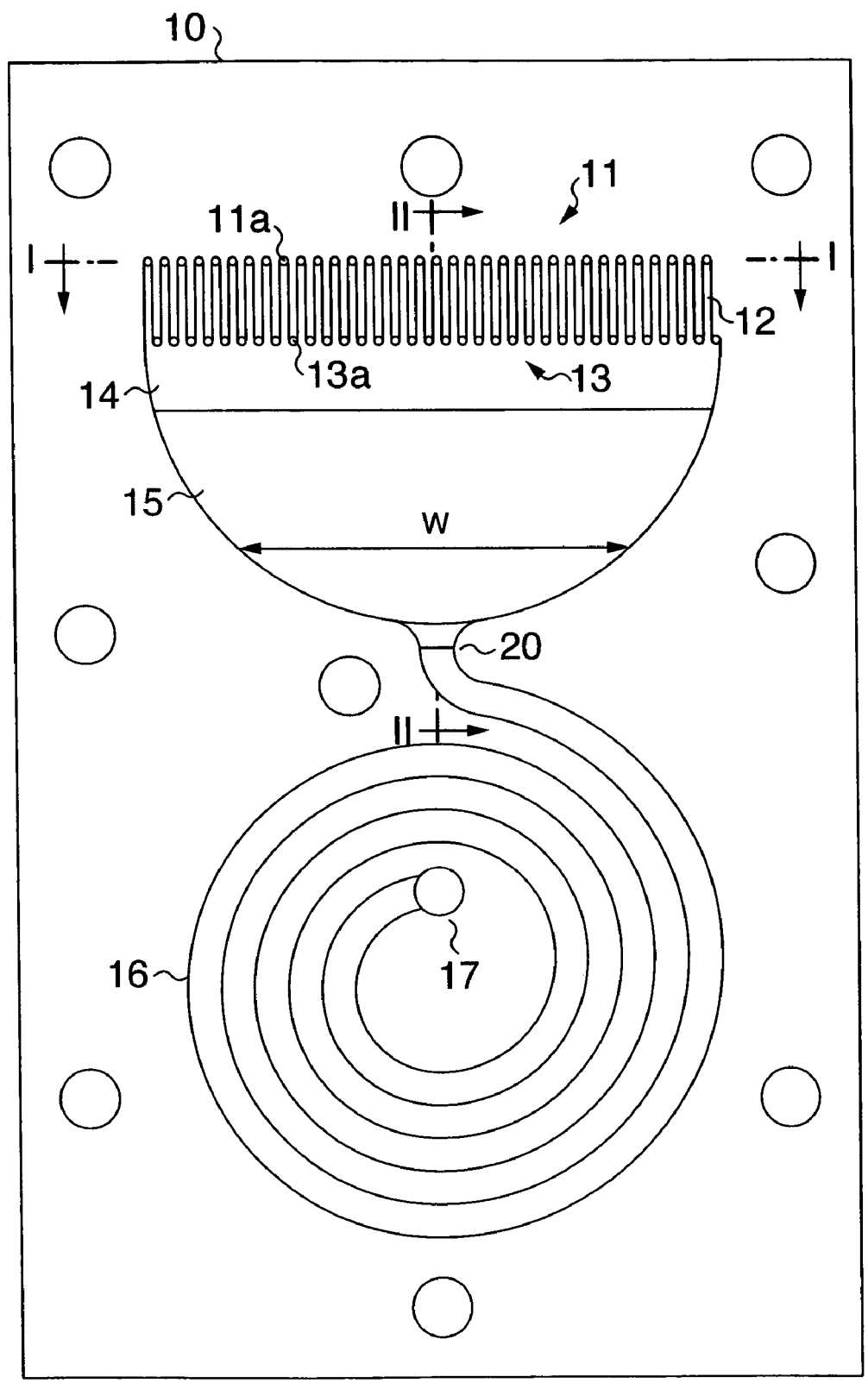
FIG. 2 is a front view showing a micro fluid chip body shown in FIG. 1.

FIG. 2 is a front view showing one main surface of the micro fluid chip body 10, which comprises a first liquid supply 11, a first liquid leading flow passage portion 12, a second liquid supply 13, a laminate flow forming portion 14, a flow flattening portion 15, a processing portion 16, and a liquid discharge portion 17.

Here, a basin extending from the first liquid supply 11 to the laminate flow forming portion 14 makes a liquid supply to supply a plurality of flows, which are formed by dividing at least two kinds of liquids, in a manner to arrange the same alternately, and the processing portion 16 comprises a minute flow passage, in which liquids are mixed and reacted (chemical reaction).

The micro fluid chip body 10 is provided with grooves, which have various shape and extend from liquid supplies described concretely later to a liquid discharge port, and the lid member 30 fixed closely to a surface of the micro fluid chip body 10 functions as a lid to seal the grooves.

The first liquid supply 11 comprises a multiplicity of first liquid supply nozzles 11a. The respective first liquid supply nozzles 11a are composed of holes provided to extend from a back surface (a main surface on a side of the adapter member 50) of the micro fluid chip body 10 to a front surface (a main surface on a side of the lid member 30) in a manner to align in row with a predetermined spacing in a widthwise direction of the micro fluid chip body 10.

Figure 3:
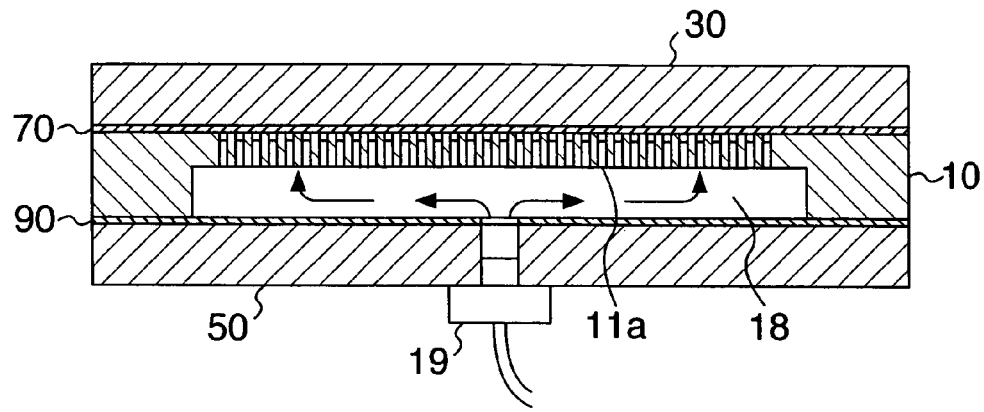
FIG. 3 is a transverse cross sectional view of the micro fluid chip body taken along the cutting plane line I-I in FIG. 2.

FIG. 3 is a transverse cross sectional view showing the micro fluid chip body 10 along the cutting plane line I-I in FIG. 2, and a buffer tank 18 that temporarily collects a first liquid being a supplied liquid is provided below (a back surface on the side of the adapter member 50) the respective first liquid supply nozzles 11a. The buffer tank 18 is defined by a recess provided on the back surface of the micro fluid chip body 10 and the adapter member 50.

A first liquid supply head 19 is mounted in that position on the adapter member 50, which corresponds to the buffer tank 18, so that the first liquid supplied from the first liquid supply head 19 fills up the buffer tank 18 and is then supplied evenly to all the first liquid discharge nozzles 11a as a liquid level rises. As a result, the first liquid is discharged from all the first liquid discharge nozzles 11a, and the respective liquids pass through the first liquid leading flow passage portion 12, which are extended from the respective nozzles, to move to the laminate flow forming portion 14.

A second liquid supply 13 comprises a multiplicity of second liquid discharge nozzles 13a positionally offset a magnitude of one nozzle from the first liquid discharge nozzles 11a in the widthwise direction of the micro fluid chip body 10, and has the same construction as that of the first liquid supply 11 in that it is associated with a buffer tank, a second liquid supply head, etc.

A second liquid is discharged from all the second liquid discharge nozzles 13a to be supplied to the laminate flow forming portion 14.

Figure 4:
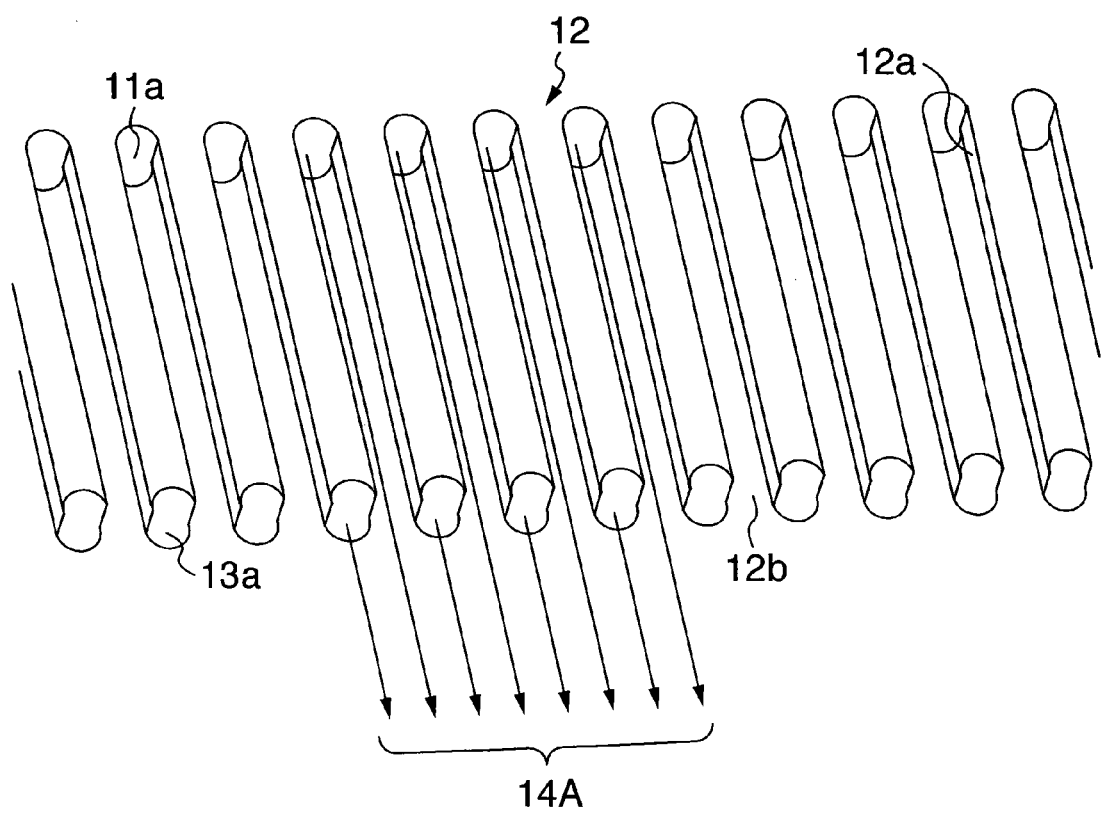
FIG. 4 is a partial enlarged view showing a laminate flow forming portion in the micro fluid chip body shown in FIG. 1.

As shown in enlarged scale in FIG. 4, the first liquid leading flow passage portion 12 comprises first liquid leading flow passages 12b between a multiplicity of barriers 12a extending from positions of the respective first liquid discharge nozzles 11a in a lengthwise direction (a direction of flow of the first liquid) of the micro fluid chip body 10, and the first liquid flows down through the first liquid leading flow passages 12b.

The multiplicity of second liquid discharge nozzles 13a are apertured at downstream ends of the barriers 12a, and the both liquids discharged from the respective first liquid discharge nozzles 11a and the respective second liquid discharge nozzles 13a form a laminate flow 14A, in which two kinds of liquids are arranged alternately, in the laminate flow forming portion 14 due to positional offset of the both nozzles 11a, 13a.

By forming the laminate flow, a ratio of a contact area to a total volume of the two kinds of liquids is increased to activate molecular diffusion generated on contact surfaces to increase an extent of molecular diffusion in a particular period of time, so that high efficiency in processing in the micro fluid chip is realized. With the same volume, the processing efficiency in the micro fluid chip is proportional to the number of layers in the laminate flow.

The laminate flow 14A formed in the laminate flow forming portion 14 flows subsequently to move to the flow flattening portion 15.

In mixing of liquids due to molecular diffusion, what affects a period of time elapsed until completion of mixing is a thickness (=diffusion length of molecules and particles) of liquid in a direction perpendicular to a contact interface and involves the relationship, in which time is proportional to the square of the thickness. In case of, for example, diffusion of 1 mm in 10 seconds, time amounts only to 2.5 seconds as short as ¼ when the diffusion length is shortened to 0.5 mm as small as ½.

On the basis of such relationship, the flow passage in the flow flattening portion 15 is constricted in width in a direction perpendicular to the contact interface. Thereby, it becomes possible to decrease the diffusion length to perform mixing of liquids at high speed.

Also, in the case where a ratio of flow passage width before and after constriction assumes the same value, alternately arranged rows of the second liquid discharge nozzles 13a positionally offset a magnitude of one nozzle from the first liquid discharge nozzles 11a in the widthwise direction of the micro fluid chip body 10 is increased in number and the more the number of layers in the laminate flow, the smaller the thickness per layer, whereby it suffices that a period of time elapsed until completion of mixing be short.

Normally, when a flow passage is constricted in width, the flow passage is decreased in cross sectional area, whereby pressure loss per unit length in the flow passage increases as it goes downstream. In particular, in trying to supply a liquid to a micro fluid chip in a large flow rate, pressure loss in a flow passage exceeds the performance limit of a pump (not shown) arranged upstream of the first liquid supply head 19 or the like, so that it becomes impossible to supply a liquid.

Figure 5:
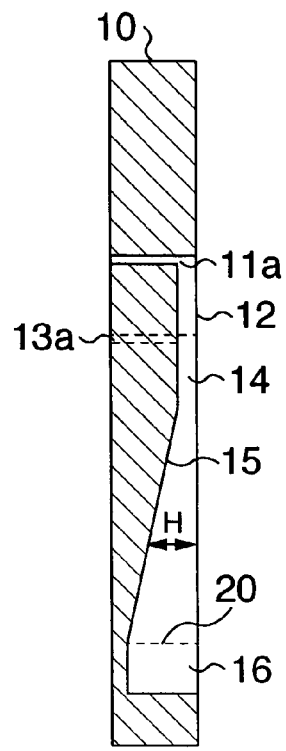
FIG. 5 is a partial vertical cross sectional view of the micro fluid chip body taken along the cutting plane line II-II in FIG. 2.

Hereupon, the embodiment provides a structure, in which an increase in pressure loss is prevented by using a sheet material having a thickness of several mm for the micro fluid chip body 10, which is in many cases conventionally manufactured by a thin sheet of the order of 0.5 mm, to provide the flow flattening portion 15, in which a flow passage width W is constricted as shown in FIG. 2 as it goes downstream, in proportion thereto a flow passage depth H is increased as shown in FIG. 5, which is a partial vertical cross sectional view along the cutting plane line II-II in FIG. 2, and flow passages are maintained constant in cross sectional area. The flow flattening portion 15 can be said to be a diffusion length shortened portion having the function of preventing an increase in pressure loss.

In this case, even when the flow passage depth H is increased, flow in a flow passage is maintained in a state of laminar flow, so that the laminate flow 14A is not made turbulent and molecular diffusion is not disturbed.

Figure 6:
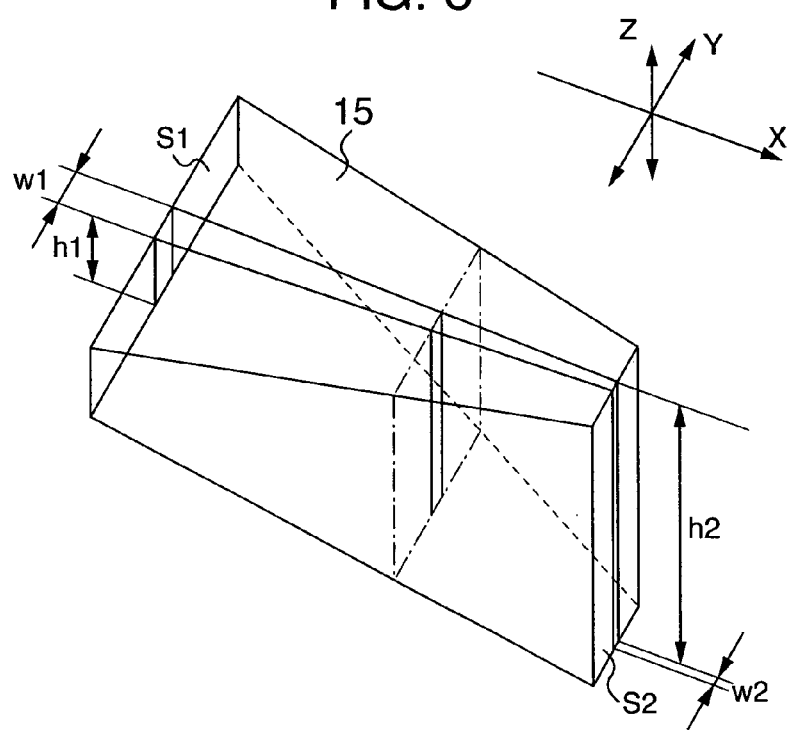
FIG. 6 is a view illustrating a flow flattening portion on the micro fluid chip body shown in FIG. 1.

As shown in FIG. 6, a direction of flow is represented by a X direction, a widthwise direction (a direction, in which alternately arranged liquids in the liquid supply 11 are arranged) is represented by a Y direction, and a depthwise direction (a direction intersecting that direction, in which alternately arranged liquids in the liquid supply 11 are arranged, and the direction of flow) is represented by a Z direction. Respective layers in the laminate flow are flattened in the flow flattening portion 15 so as to be decreased in thickness as they go downstream (a thickness w1⇒w2), and to be instead increased in the depthwise direction (Z direction) (a depth h1⇒h2), and the respective layers are substantially the same (a cross sectional area S2≈S1) in cross sectional area in a direction intersecting the direction of flow both on a side (a cross sectional area S1) of the upstream laminate flow forming portion 14 and on a side (a cross sectional area S2) of the downstream processing portion 16. It is better when the cross sectional area is somewhat increased (a cross sectional area S2≧S1) as it goes downstream.

It suffices that a cross sectional shape at a connection 20 to the processing portion 16 be determined according to a thickness of the micro fluid chip body 10 and a length of the processing portion 16 described later.

While the flow flattening portion 15 is semi-spherical in shape as viewed from a front of the micro fluid chip body 10 in FIG. 2, it is not limited in shape but it may be triangular. Also, a shape such as semi-spherical shape, triangular shape, or the like may simulate a stepped shape in minute pitch and a gentle inclination in the depthwise direction may be stepwise in conformity to the shape.

The liquid having passed through the laminate flow forming portion 15 moves to the processing portion 16.

The processing portion 16 is kept in cross sectional area at the connection 20 to the flow flattening portion 15 in a direction intersecting the flow, to the liquid discharge portion (liquid discharge port) 17 as it is.

This is because a cross sectional shape of the flow passage is made the same to facilitate processing and to make that calculation, by which a mixed state of liquids is deduced, easy. However, when the micro fluid chip body 10 affords a margin in thickness, the flow flattening portion 15 can be increased in flow passage depth H to increase a ratio of interface area/whole volume of the laminate flow 14A, so that it is also possible to enhance the mixing capacity.

Figure 7:
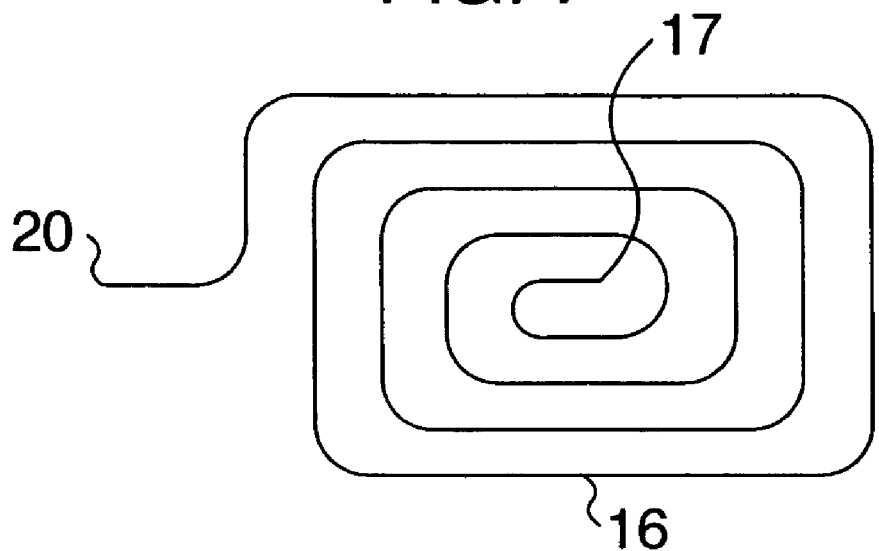
FIG. 7 is a view imitatively showing a shape applied to a minute flow passage in a processing portion in the micro fluid chip body shown in FIG. 1.
Figure 8:
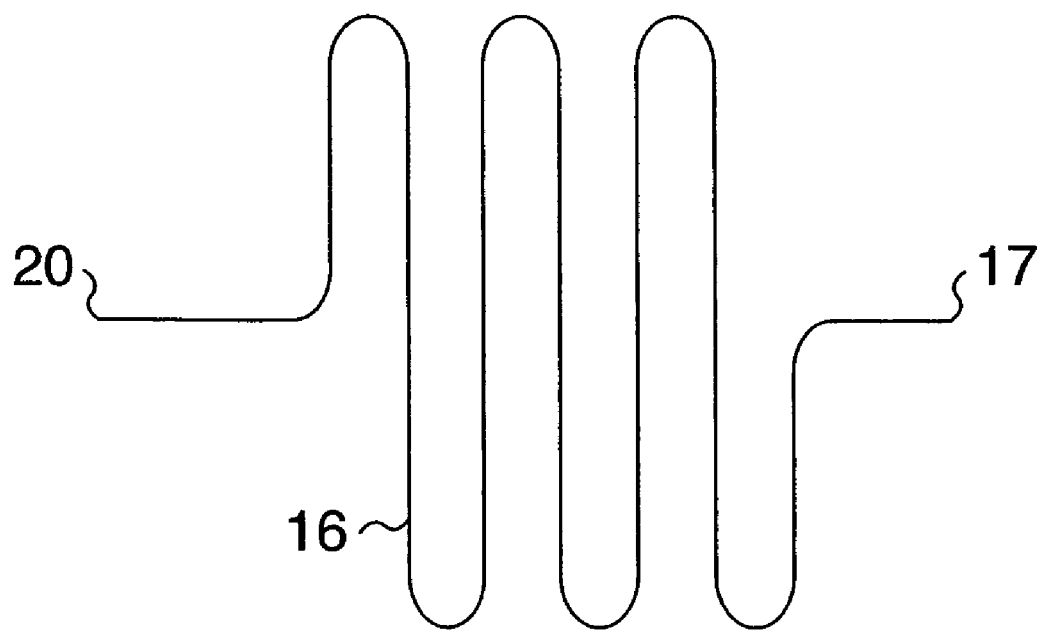
FIG. 8 is a view imitatively showing a further shape applied to the minute flow passage in the processing portion on the micro fluid chip body shown in FIG. 1.

While the processing portion 16 in the embodiment is circularly spiral in shape, it may be otherwise in shape, such as rectangularly spiral in shape as shown in FIG. 7, hexagonally spiral in shape (not shown), meandering in shape as shown in FIG. 8, or the like provided that a stagnation time required until completion of mixing can be found by means of calculation and a necessary flow passage length deduced therefrom can be ensured on the micro fluid chip body 10.

Mixing of liquids is completely terminated during passage through the processing portion 16, and a processed liquid having been uniformly mixed is discharged outside an apparatus from the liquid discharge portion 17. A processed liquid discharge head (not shown) is provided on the adapter member 50 in a location corresponding to the liquid discharge portion 17 whereby a processed liquid is obtained through the processed liquid discharge head.

As far as liquids are put in a state of laminar flow, the mixing capacity of the micro fluid chip 1 according to the invention is determined by the number of layers in the laminate flow 14A and a ratio of flow passage width before and after the flow flattening portion 15. Therefore, minute nozzles and grooves as in conventional micro fluid chips are not necessarily required and respective nozzles and grooves can exhibit the performance as a combination of nozzles and grooves, which are in the order of several hundreds μm to several mm, so that workability is excellent.

While the laminate flow 14A is transversely arranged in the embodiment shown in FIG. 2, it may be arranged in a thickness-wise direction of the micro fluid chip body 10, that is, longitudinally arranged such that the Y direction and the Z direction are turned 90 degrees about a X axis and so a Y axis is in the Z direction in FIG. 6.

While the embodiment has been described with respect to an example, in which two liquids are mixed together, it suffices that many liquid supplies be provided in the case where it is desired that three or more liquids be mixed together.

An explanation will be given to an embodiment of a micro fluid chip, in which two kinds of liquids being different in viscosity from each other are mixed together.

Figure 9:
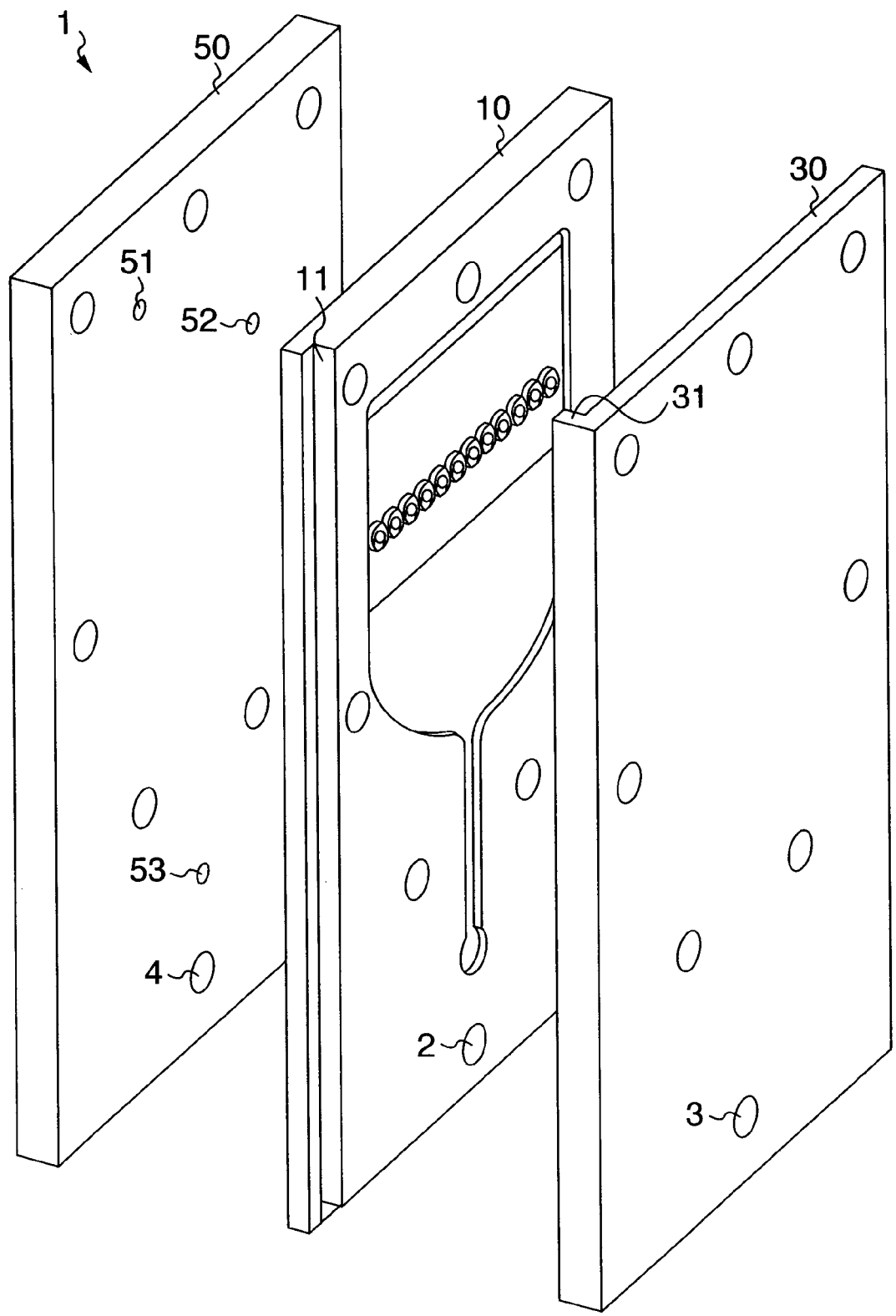
FIG. 9 is a schematic exploded perspective view showing a micro fluid chip according to a further embodiment of the invention.

FIG. 9 is a schematic exploded perspective view showing a micro fluid chip 1, the micro fluid chip 1 comprising a micro fluid chip body 10 formed from a plate, which is made of metal, glass, silicone, resin, etc. according to a kind of liquid being subjected to processing such as mixing, reaction, or the like and has a thickness of several mm, a lid member 30 arranged on one main surface of the micro fluid chip body 10 to constitute a roof portion of a flow passage in the micro fluid chip body 10, an adapter member 50 arranged on another main surface of the micro fluid chip body 10 opposed to the lid member 30 to couple a liquid feed mechanism such as a pump, etc. and the chip, and sealing members 70, 90 (see FIGS. 12 and 13) arranged among these three members, and these elements being clamped by screws (not shown), which extend through eight threaded holes 2 to 4 peripherally provided, to prevent liquid leakage.

While an adhesive packing material, a metallic packing material, etc. may be used for the sealing members, other methods such as laser bonding, adhesives, etc. may be used to fix the lid member 30 and the adapter member 50 directly to two sides of the micro fluid chip body 10.

A L-shaped concave guide 11 for positioning is provided rightward and downward on the chip body 10 as viewed from a flow passage side, and a L-shaped convex guide 31 is provided on the lid member 30 to correspond to the concave guide 11, so that accurate positioning can be easily made by combining the concavity and the convexity of the guides when the chip body 10 and the lid member 30 are to be clamped together.

Holes 51 to 53 making passages for stock solutions being supplied and processed liquids being discharged are provided on the adapter member 50, and similar holes are provided on a sealing member 90 (see FIGS. 12 and 13), which is provided between the chip body 10 and the adapter member 50, in positions corresponding to the holes 51 to 53. As described later, on a back surface side of the adapter member 50, a head (plug or joint) for supplying of a low-viscosity liquid is connected to the hole 51 and a head (plug or joint) for supplying of a high-viscosity liquid is connected to the hole 52.

Figure 10:
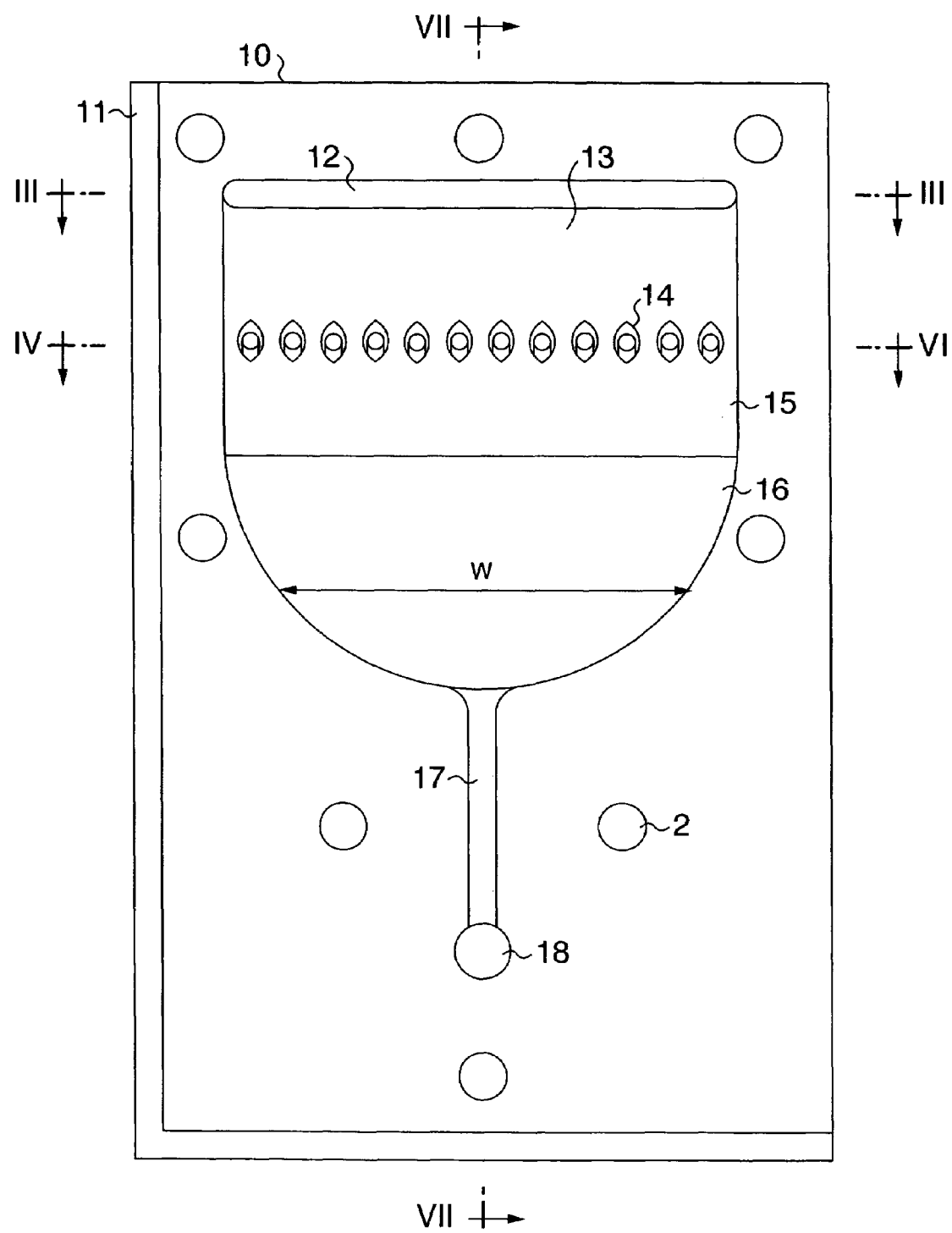
FIG. 10 is a front view showing the micro fluid chip body shown in FIG. 9.

FIG. 10 is a front view showing one main surface of the micro fluid chip body 10, which comprises a first liquid supply 12 being flat oval in shape, a plurality of second liquid supplies 14, a laminate flow forming portion 15, a flow flattening portion 16, a processing portion 17, and a liquid discharge portion 18.

According to the embodiment, a basin extending from the first liquid supply 12 to the laminate flow forming portion 15 makes a liquid supply to supply a plurality of flows, which are formed by dividing at least two kinds of liquids, in a manner to arrange the same alternately, and the processing portion 17 comprises a minute flow passage, in which liquids are mixed and reacted.

A low-viscosity liquid is discharged from the first liquid supply 12 and a high-viscosity liquid is discharged from the second liquid supplies 14, the first liquid supply 12 being disposed on an upstream side and the second liquid supplies 14 being disposed on a downstream side.

The plurality of second liquid supplies 14 are arranged at desired uniform spacing along a lengthwise direction of the flat oval shape of the first liquid supply 12, that is, perpendicularly to a direction of flow of the low-viscosity liquid.

A flow passage 13 of the low-viscosity liquid extends from the first liquid supply 12 to the second liquid supplies 14. Mixing and reaction of the liquids gradually progress also in the laminate flow forming portion 15 and the flow flattening portion 16. In addition, the constitution of these portions will be described later.

Figure 11:
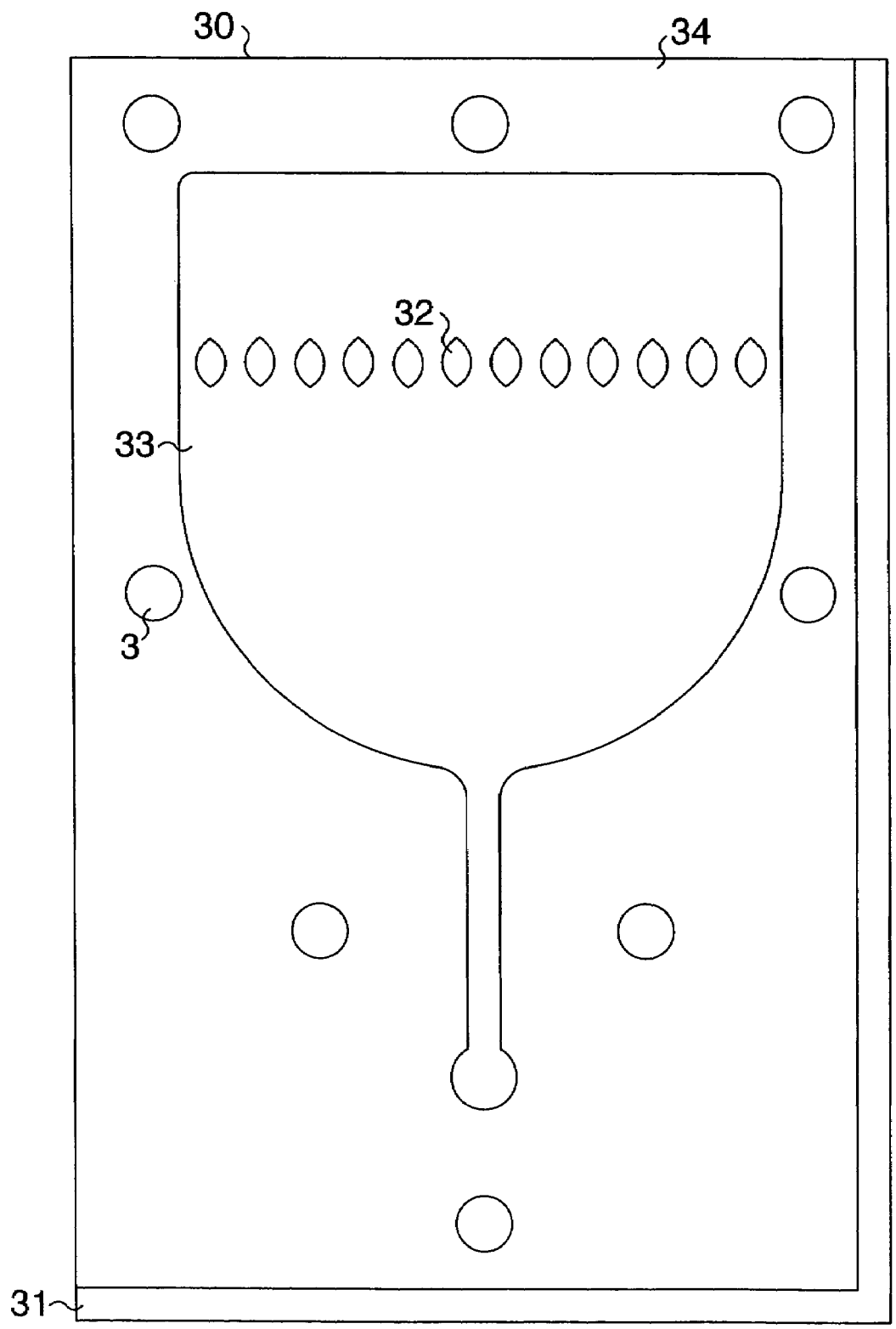
FIG. 11 is a rear view showing a lid member shown in FIG. 9.

FIG. 11 is a front view showing a side of the lid member 30 in contact with the micro fluid chip body 10, the lid member comprising a plurality of second liquid lid portions 32 making a lid for the plurality of second liquid supplies 14, and a flow passage lid portion 33 being a lid for the remaining flow passages of the micro fluid chip body 10. The flow passage lid portion 33 is formed by cutting a surface of the lid member 30, and is lower by a step than a surface 34 in contact with the second liquid lid portions 32 and the sealing member 70 (see FIGS. 12 and 13). In addition, the sealing member 70 includes openings conformed in shape to the eight threaded holes 3 and the flow passage lid portion 33, so that liquids come into contact with the flow passage lid portion 33.

The micro fluid chip body 10 is provided with grooves, which have different shapes and extend from a liquid supply, described concretely later, to a liquid discharge port, and the lid member 30 fixed closely to a surface of the micro fluid chip body 10 functions as a lid to seal the grooves, and the respective grooves and the lid member 30 constitute the respective flow passages (13, 15 to 17) described above.

Figure 12:
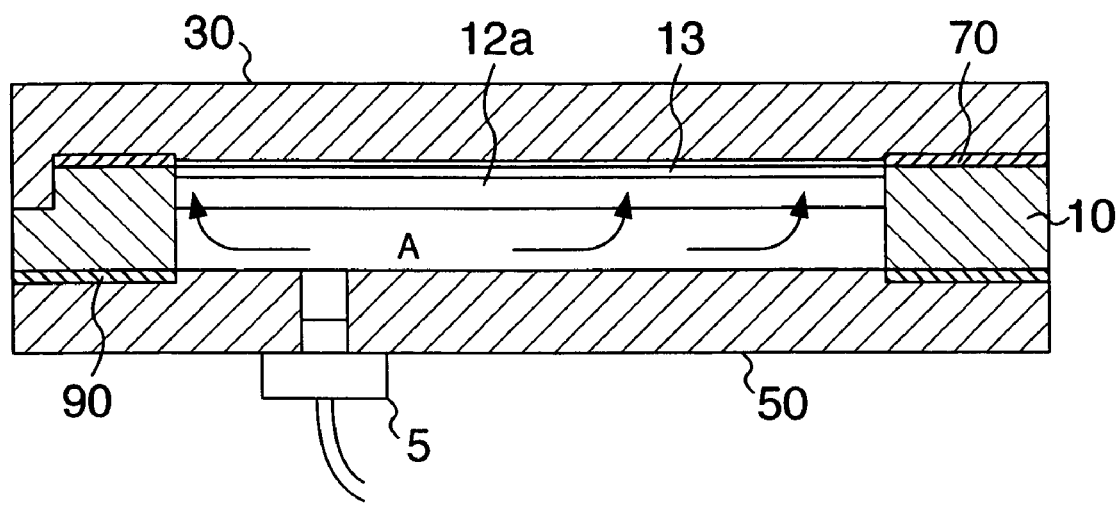
FIG. 12 is a transverse cross sectional view of the micro fluid chip taken along the cutting plane line III-III in FIG. 10.

FIG. 12 is a transverse cross sectional view showing the micro fluid chip body 10 in a position along the cutting plane line III-III in FIG. 10, the first liquid supply 12 being provided with a single oval nozzle as a first liquid discharge port 12a.

A first liquid supply head 5 is mounted to the adapter member 50 to be disposed in a position corresponding to the first liquid discharge port 12a, so that a first liquid (low-viscosity liquid) A supplied from the first liquid supply head 5 fills up the first liquid discharge port 12a as a liquid level rises, to form a flow in the form of a thin sheet having the same width as a total width of the flow passage 13 shown in FIG. 10.

Figure 13:
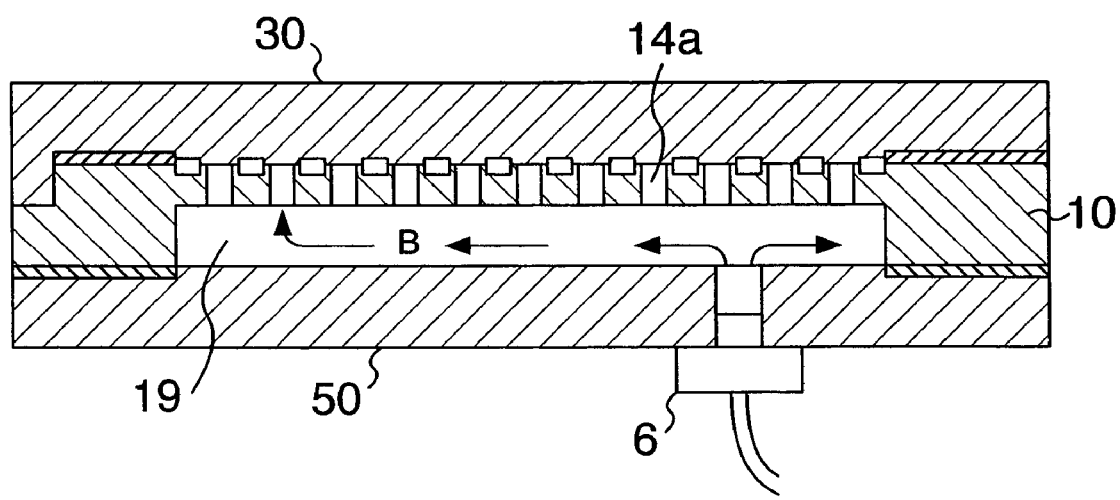
FIG. 13 is a transverse cross sectional view of the micro fluid chip taken along the cutting plane line IV-IV in FIG. 10.

FIG. 13 is a transverse cross sectional view showing the micro fluid chip body 10 in a position along the cutting plane line IV-IV in FIG. 10.

As shown in FIG. 13, the second liquid supplies 14 comprise a multiplicity of second liquid supply ports 14a, and the respective second liquid supply ports 14a comprise holes provided to extend from a back surface (a main surface on a side of the adapter member 50) of the micro fluid chip body 10 to a front surface (a main surface on a side of the lid member 30) in a manner to align in row with a predetermined spacing in a widthwise direction of the micro fluid chip body 10.

A buffer tank 19 that temporarily collects a second liquid (high-viscosity liquid) B is provided on a back surface of the micro fluid chip body 10 on the side of the adapter member 50 in a manner to communicate with the respective second liquid supply ports 14a. The buffer tank 19 is defined by a recess provided on the back surface of the micro fluid chip body 10 and the adapter member 50.

A second liquid supply head 6 is mounted in that position on the adapter member 50, which corresponds to the buffer tank 19, so that the second liquid B supplied from the second liquid supply head 6 fills up the buffer tank 19 and is then supplied evenly to all the second liquid supply ports 14a as a liquid level rises. As a result, the second liquid is divided into flows from all the second liquid supply ports 14a to be discharged therefrom.

Figure 14:
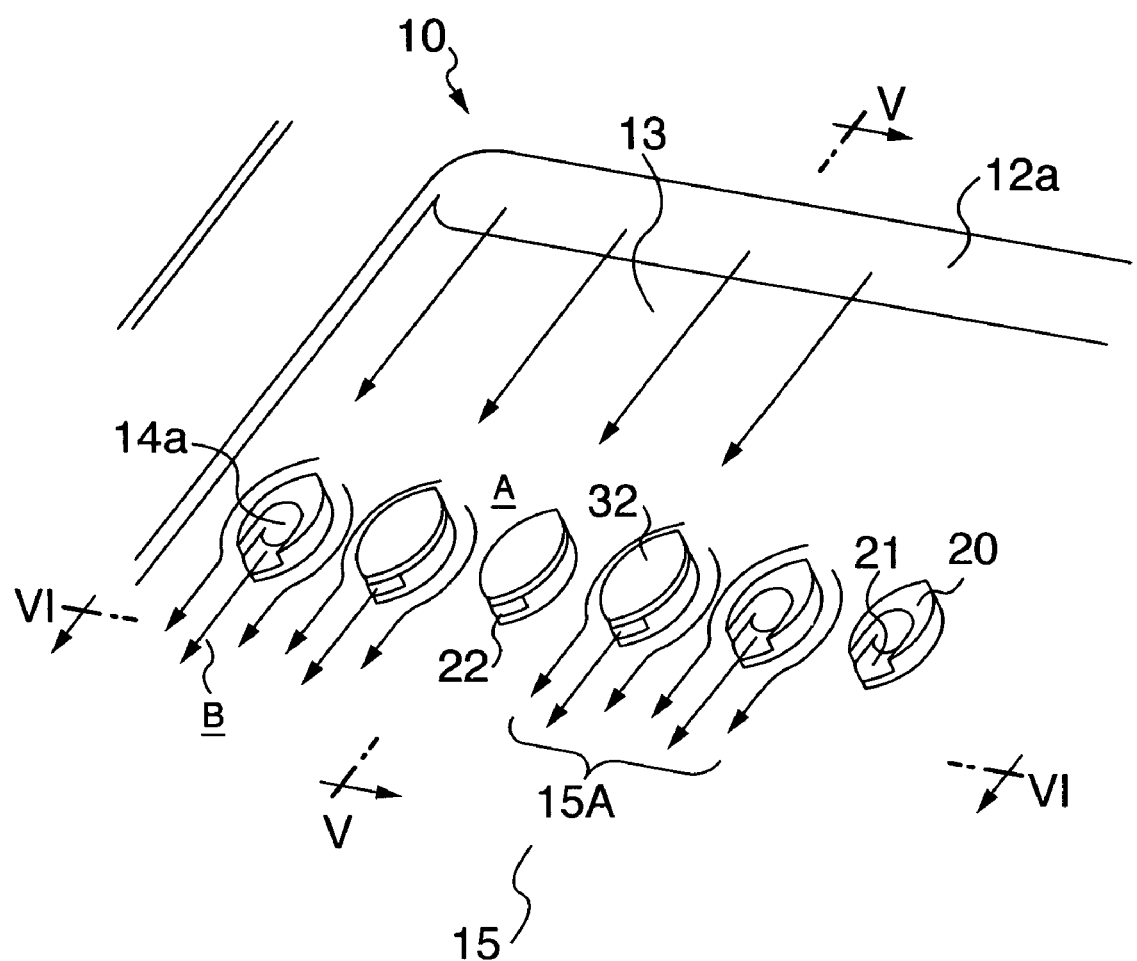
FIG. 14 is a partial perspective view showing a state of liquid flows in the micro fluid chip shown in FIG. 10.

FIG. 14 shows, in enlarged scale, an essential part of that surface of the micro fluid chip body 10, which extends from the first liquid supply 12 to the laminate flow forming portion 15.

The respective second liquid supply ports 14a are surrounded by substantially rhombic-shaped projections 20, of which respective tops are flat, and the respective second liquid lid portions 32 abuts against the flat surfaces. The respective second liquid lid portions 32 are the same in shape as the projections 20. The respective projections 20 are provided with recesses 21 that are directed downstream from the respective second liquid supply ports 14a, and bottoms of the recesses 21 are positioned higher than the flow passage 13 and the laminate flow forming portion 15.

Since the respective second liquid supply ports 14a are sealed by the respective second liquid lid portions 32 that project a step from the flow passage lid portion 33, the second liquids from the respective recesses 21 join the first liquid A flowing through the flow passage 13. Therefore, the respective second liquid supply ports 14a and the respective recesses 21 in communication therewith constitute guide passages for the respective second liquids B. Openings of the guide passages, that is, openings 22 defined by the respective recesses 21 and the respective second liquid lid portions 32 to be directed toward the laminate flow forming portion 15 are separated from both a bottom of the flow passage 13 and a roof portion of the flow passage lid portion 33. Accordingly, the respective second liquids B are discharged into the first liquid (low-viscosity liquid) A, which flows through the flow passage 13, from the openings 22 to come into no contact with the bottom of the laminate flow forming portion 15 and the roof portion of the flow passage lid portion 33.

This state will be described by means of arrows, shown in FIG. 14, indicative of flow directions of the respective liquids. In addition, a part of the second liquid lid portions 32 is shown in order to make it easy to grasp flows of the respective liquids.

The first liquid A having a low viscosity and discharged from the first liquid discharge port 12a makes a sheet-shaped flow and moves while filling up the whole flow passage 13 to contact with the second liquid lid portions 32 and the respective projections 20 of the second liquid supplies 14. Since the sheet-shaped flow constitutes a laminar flow, it is divided, after the contact, in a manner to surround the second liquid lid portions 32 and the respective projections 20 as shown by the arrows in the figure without turbulence, and again joins together at downstream ends of the respective projections 20.

Figure 15:
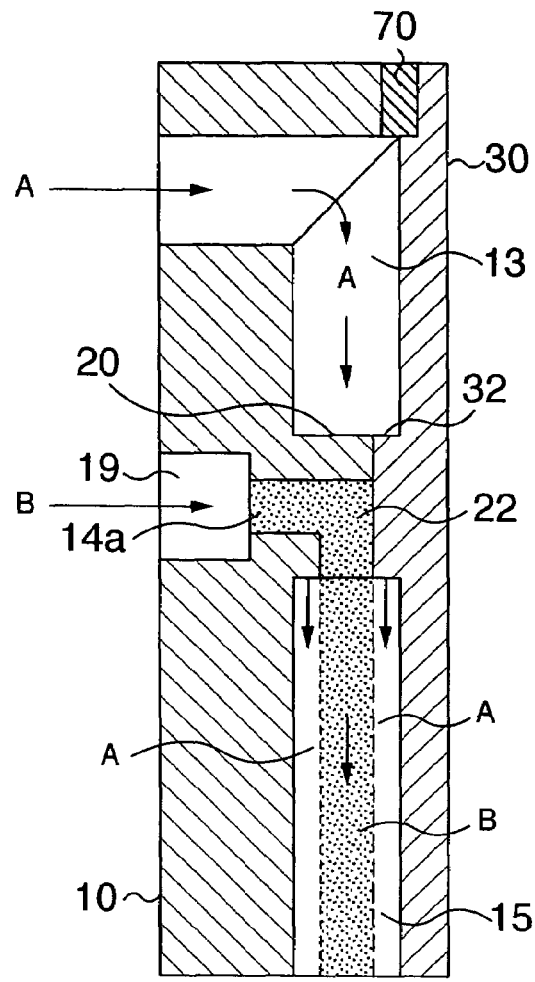
FIG. 15 is a partial vertical, cross sectional view of the micro fluid chip taken along the cutting plane line V-V in FIG. 14.

As shown in FIG. 15, which is a vertical cross sectional view taken along the cutting plane line V-V in FIG. 14, the openings 22, from which the second liquids B are discharged, are higher by a step than the bottom of the flow passage, and the second liquid lid portions 32 project a step from the roof portion of the flow passage. Accordingly, the high-viscosity liquids (second liquids) B discharged from the respective openings 22 are discharged into the flow of the first liquid A, which joins together at downstream ends of the respective projections 20, to go forward to the laminate flow forming portion 15.

Figure 16:
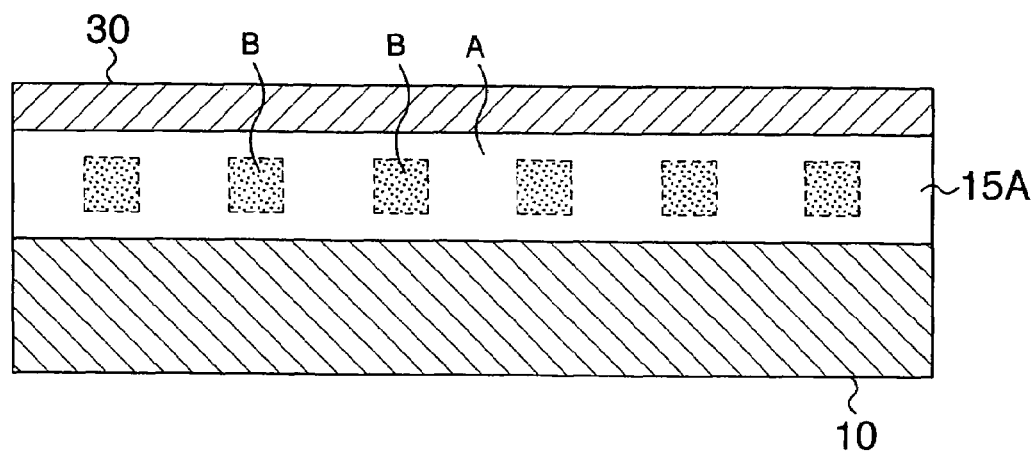
FIG. 16 is a partial vertical cross sectional view of the micro fluid chip taken along the cutting plane line VI-VI in FIG. 14.

When the second liquids B are discharged from the respective openings 22, the first liquid A having a low viscosity flows therearound, so that as shown in FIG. 16, which is a transverse cross sectional view taken along the cutting plane line VI-VI in FIG. 14, the second liquids B having a high viscosity forms a flow, a whole periphery of which is surrounded by the first liquid A, so that the second liquids B having a high viscosity do not contact with wall surfaces of the flow passage.

Thereby, it is made possible to prevent an increase in pressure loss, caused by contact between the wall surfaces and the high-viscosity liquid, as well as stagnation and accumulation of the high-viscosity liquid, which accompany such increase, thus enabling accurately feeding a liquid. At this time, when an associated flow constitutes a laminar flow, the second liquid supply ports 14a, from which the high-viscosity liquid is supplied, is desirably large in diameter in order to suppress pressure loss at the second liquid supply ports 14a.

Since flows, which are the same in number as the respective second liquid supply ports 14a of the second liquid supplies 14 arranged in a row in the widthwise direction of the micro fluid chip body 10, are formed in parallel, a laminate flow 15A, in which the first liquid and the second liquid are arranged alternately, is formed at the laminate flow forming portion 15 as shown in FIGS. 14 and 16. That is, the reason for the provision of the laminate flow forming portion 15 resides in obtaining that laminate flow 15A, in which the first liquid and the second liquid are arranged alternately.

The laminate flow 15A is specifically configured such that the second liquid B divided into flows is surrounded by the first liquid A, so that it is possible to have an effect that a ratio of contact areas to a total volume of two kinds of liquids is increased. As a result, molecular diffusion generated on respective contact surfaces is activated to increase an extent of molecular diffusion in a particular period of time, so that high efficiency in the micro fluid chip is realized (with the same volume, the efficiency in the micro fluid chip is proportional to the number of layers of the laminate flow 15A).

The laminate flow 15A formed in the laminate flow forming portion 15 flows subsequently to move to the flow flattening portion 16.

As shown in FIG. 17, which is a vertical cross sectional view taken along the cutting plane line VII-VII in FIG. 10, the laminate flow 15A is increased in depth and constricted in flow passage width in the flow flattening portion 16.

In this case, in the same manner as in the flow flattening portion 15 of FIG. 2, the flow passage is maintained constant (a cross-sectional area S1≈S2) in cross sectional area so that a cross sectional area in a direction intersecting the direction of flow becomes substantially the same both on a side (a cross sectional area S1) of the upstream laminate flow forming portion 15 and on a side (a cross sectional area S2) of the downstream processing portion 17.

Thereby, even when the flow passage is increased in depth H, flow in the flow passage is maintained in a state of laminar flow, so that the laminate flow 15A is not made turbulent and molecular diffusion is not disturbed. As a result, pressure loss is not increased, diffusion length is shortened, and it becomes possible to perform mixing of liquids at high speed. That is, the flow flattening portion 16 is a diffusion length shortened portion having the function of preventing an increase in pressure loss.

The flow flattening portion 16 is preferably somewhat increased in cross sectional area (a cross sectional area S2≧S1) as it goes downstream. It suffices that a cross sectional shape of the flow flattening portion 16 be determined according to a thickness of the micro fluid chip body 10 and a length of the processing portion 17 described later.

While the flow flattening portion 16 is semi-spherical in shape as viewed from a front of the micro fluid chip body 10 in FIG. 10, it is not limited in shape but it may be triangular in shape. Also, in case of a sufficiently small Reynolds number such as a low velocity of liquid flow or the like, a shape such as semi-spherical shape, triangular shape, or the like may simulate a stepped shape in minute pitch and a gentle inclination in the depthwise direction may be stepwise in conformity to the shape.

The liquid having passed through the laminate flow forming portion 16 moves to the processing portion 17.

The processing portion 17 is maintained in width and depth at the connection to the flow flattening portion 16 in a direction intersecting the flow, to the liquid discharge portion (liquid discharge port) 18 as it is.

This is because a cross sectional shape of the flow passage is made the same to facilitate processing and to make that calculation, by which a mixed state of liquids is deduced, easy. However, when the micro fluid chip body 10 affords a margin in thickness, the flow flattening portion 16 can be increased in flow passage depth H to increase a ratio of interface area/whole volume of the laminate flow 15A, so that it is also possible to enhance the mixing capacity.

Mixing of the liquids is completely terminated during passage through the processing portion 17, and a processed liquid having been uniformly mixed is discharged outside an apparatus from the liquid discharge portion 18. A processed liquid discharge head (not shown) is provided on the adapter member 50 in a location corresponding to the liquid discharge portion 18 whereby the processed liquid is obtained through the processed liquid discharge head.

According to the embodiment, since the high-viscosity liquid is surrounded by the low-viscosity liquid to heighten the interface area ratio and the high-viscosity liquid and the low-viscosity liquid are further made a laminate flow to be constricted, mixing of the liquids can be performed in high efficiency as compared with mixing in an ordinary simple laminate flow, in which two liquids are arranged alternately in the processing portion 17.

Also, since the high-viscosity liquid is free from stagnation due to pressure loss in the course of flowing and a ratio of the high-viscosity liquid and the low-viscosity liquid is not varied between an upstream side and a downstream side, it is possible to continuously obtain a processed liquid having a desired mixing ratio and a processed liquid having been reacted to a desired volume.

With the micro fluid chip 1 according to the above mentioned embodiment, a single chip makes it possible to perform high-speed and uniform mixing and reactions of a plurality of liquids, which include a high-viscosity liquid, in a processing flow rate of several tens ml/min.

Also, a multiplicity of discharge nozzles, of witch size is easy to process are formed, a laminate flow 15A, in which a multiplicity of flows with the high-viscosity liquid surrounded by the low-viscosity liquid are arranged in parallel, is formed, and high-speed mixing and reactions can be realized by constricting the flows, so that a micro fluid chip can be manufactured without a high, fine processing technique.

While the processing portion 17 in the embodiment is linear in shape, it may be otherwise in shape, such as spiral in shape as shown in FIG. 2, meandering in shape as shown in FIG. 8, or the like provided that it is intended to find a stagnation time required until completion of mixing by means of calculation and to ensure a necessary flow passage length deduced therefrom, on the micro fluid chip body 10.

As far as liquids are put in a state of laminar flow, the mixing capacity of the micro fluid chip 1 is determined by the number of layers in the laminate flow 15A and a ratio of flow passage width before and after the flow flattening portion 16. Therefore, minute nozzles and grooves as in conventional micro fluid chips are not necessarily required and respective nozzles and grooves can exhibit the performance as a combination of nozzles and grooves, which are in the order of several hundreds μm to several mm, so that workability is excellent.

While the laminate flow 15A is transversely arranged in the embodiment shown in FIG. 10, it may be arranged in a thickness-wise direction of the micro fluid chip body 10, that is, longitudinally arranged such that the Y direction and the Z direction are turned 90 degrees about a X axis and so a Y axis is in the Z direction in FIG. 10.

While the embodiment has been described with respect to mixing of two liquids, in case of performing mixing of three or more liquids elements, which correspond to the second liquid supplies 14 and the second liquid lid portions 32 matching therewith should be added. The number of elements corresponds to the number of liquids. At this time, a liquid having a lowest viscosity among liquids being used is supplied from the first liquid supply 12, and liquids are succeedingly supplied in the order of increasing viscosity.

Figure 18:
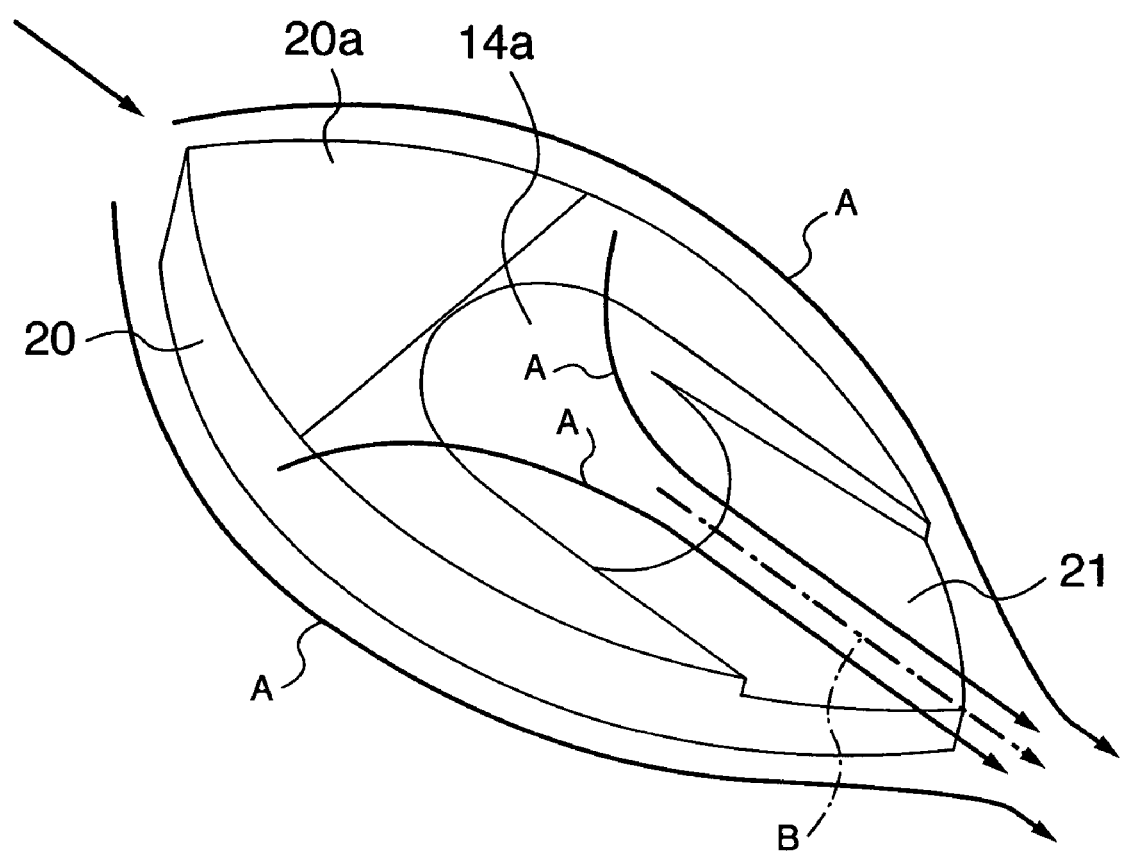
FIG. 18 is an enlarged view showing a modification of a second liquid discharge portion shown in FIG. 9.

FIG. 18 shows a projection 20 of each two-liquid discharge port 14a in a further embodiment of the invention.

According to the embodiment, a lid member 30 is in the form of a flat plate without the respective second liquid lid portions 32 and the flow passage lid portion 33 shown in FIG. 11, the projection 20 has a height to get to the lid member 30, and an inclination 24 is provided to extend from an upstream side of the second discharge port 14a on a top surface 20a of the projection 20 to a downstream side to be directed toward a bottom of a recess 21.

When the lid member 30 in the form of a flat plate is mounted there, the inclination 24 defines a clearance K between it and the lid member 30 around the second discharge port 14a as shown in FIG. 19, which is a partial vertical cross sectional view showing a micro fluid chip and corresponds to FIG. 15.

When the first liquid A having a low viscosity is supplied from the first liquid supply 12, it firstly contacts, as shown by arrows in the figure, with an upstream tip end of the projection 20 to be divided into left and right flows. A part of the divided liquids moves to the flow flattening portion 15 as it is, and another part passes through the clearance K between the inclination 24 and the lid member 30 to move in a manner to cover an upper surface of the recess 21, forms a roof flow of the first liquid, and thereafter moves to the flow flattening portion 15.

When the second liquid B having a high viscosity is supplied in this state, it is possible to form a flow, in which the second liquid B having a high viscosity is surrounded by the first liquid A having a low viscosity, to prevent an increase in pressure loss, which is caused by contact between the high-viscosity liquid B and wall surfaces of the flow passage.

In comparing with the embodiment shown in FIG. 9, it suffices in this embodiment that the lid member 30 be in the form of a flat plate, and so the processing for forming the second liquid lid portions 32 and the flow passage lid portion 33 on a back surface of the lid member can be omitted and productivity should be excellent. Also, since there is no need of correctly sticking the second liquid lid portions 32 to the projection 20, positioning at the time of assembly is easy.

In addition, since it suffices in this embodiment to be able to form a roof flow of the first liquid, which passes through the clearance K between the inclination 24 and the lid member 30 to move in a manner to cover the upper surface of the recess 21, the inclination 24 therefor may be set to be optional in shape.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A micro fluid chip that leads liquids supplied from a plurality of liquid supply ports, respectively, to a minute flow passage, performs mixing/reaction of the liquids in the minute flow passage, and obtains a liquid having been processed from a liquid discharge port, wherein the liquid supply ports allow at least two kinds of liquids, which are different in viscosity from each other, to be supplied individually, a guide passage for a high-viscosity liquid is opened to a flow passage of a low-viscosity liquid to be directed downward, and an opening of the guide passage is provided in flow of the low-viscosity liquid, a plate-shaped micro fluid chip body, and a lid member and an adapter member, respectively, which are gastightly attached closely to main surfaces of respective front and back sides of the micro fluid chip body, and wherein grooves are provided on the main surface of the front side of the micro fluid chip body to make a flow passage of the low-viscosity liquid and a minute flow passage contiguous to the flow passage, the lid member is attached closely to cover the grooves, the groove, which makes the flow passage of the low-viscosity liquid, comprises a projection, the projection comprises a supply port of the high-viscosity liquid communicated to the back side of the micro fluid chip body, a recess contiguous to the supply port is provided to be directed downstream of the flow passage of the low-viscosity liquid, and the lid member covers the supply port and the recess to form the guide passage for the high viscosity liquids, wherein an inclination is provided on a top surface of the projection toward the lid member to define a space between the inclination and the lid member, which is directed downstream of the flow passage of the low-viscosity liquid.

2. The micro fluid chip according to claim 1, further comprising
   a liquid supply that supplies a plurality of flows, which are formed by division of at least two kinds of liquids, in an alternate arrangement, and
   a flow flattening portion provided downstream of the liquid supply to be configured in flow passage such that liquids alternately arranged in the liquid supply are decreased in dimension in a direction, in which the liquids are arranged, as they go downstream, and increased in dimension in a direction, which intersects the direction of arrangement and a direction of flow, as they go downstream, to be made substantially the same or slightly large in cross sectional area in the direction of flow.

3. The micro fluid chip according to claim 2, wherein a processing portion is provided downstream of the flow flattening portion to have a flow passage, of which a cross sectional area at a connection thereof to the flow flattening portion in a flow intersecting direction, is maintained up to the liquid discharge port as it is, and of which a length ensures a stagnation time elapsed until mixing or reaction of the respective liquids supplied from the liquid supply is terminated.

4. The micro fluid chip according to claim 2, wherein the liquid supply supplies a plurality of flows, which are formed by division of the respective liquids, in a manner to arrange the same alternately and horizontally, and the flow flattening portion has a flow passage thereof shaped to be decreased in width, to be increased in depth, and to be made the same or slightly large in cross sectional area, as it goes downstream.

5. The micro fluid chip according to claim 2, wherein the liquid supply comprises a plurality of nozzles every liquid to divide and discharge the liquids, the nozzles are arranged alternately offset in a flow direction, the flow flattening portion is semi-circular or triangular in planar shape, and a processing portion constituting the minute flow passage is provided in a spiral manner or in a meandering manner.

6. The micro fluid chip according to claim 3, wherein the grooves are provided on the main surface of the front side of the micro fluid chip body to constitute the liquid supply, the flow flattening portion, and the processing portion, the grooves are sealed by the lid member provided on the main surface of the micro fluid chip body, the respective liquids are supplied to the liquid supply through the adapter member provided on the back side of the micro fluid chip body, and a liquid having been processed is obtained from the liquid discharge port.

7. The micro fluid chip according to claim 1, wherein the guide passage for the high-viscosity liquid is provided in plural at desired spacing in a manner to be made perpendicular to a direction along the flow passage of the low-viscosity liquid.

8. The micro fluid chip according to claim 1, further comprising a flow flattening portion provided downstream of an opening of the guide passage and upstream of the minute flow passage to have a flow passage thereof maintained constant in cross sectional area, decreased in width, and increased in depth, as it goes downstream.

* * * * *